United States Patent [19]
Webster et al.

[11] Patent Number: 6,005,403
[45] Date of Patent: Dec. 21, 1999

[54] FLEXIBLE ELECTRICAL TEST FIXTURE FOR INTEGRATED CIRCUITS ON PROTOTYPE AND PRODUCTION PRINTED CIRCUIT BOARDS

[75] Inventors: Larry D. Webster, Dublin; Ehud Pardo, Santa Clara; Jerome F. Duluk, Jr., Palo Alto, all of Calif.

[73] Assignee: Electronics Products Company, Dublin, Calif.

[21] Appl. No.: 08/984,484

[22] Filed: Dec. 1, 1997

Related U.S. Application Data

[63] Continuation of application No. 08/622,814, Mar. 27, 1996, Pat. No. 5,692,911.

[51] Int. Cl.$^6$ .................................................. G01R 31/02
[52] U.S. Cl. .................................................... 324/755
[58] Field of Search ............................ 324/754, 755, 324/765

[56] References Cited

U.S. PATENT DOCUMENTS

| | | | |
|---|---|---|---|
| 4,835,464 | 5/1989 | Slye et al. | 324/158 F |
| 4,975,638 | 12/1990 | Evans et al. | 324/158 P |
| 5,018,005 | 5/1991 | Lin et al. | 357/80 |
| 5,042,971 | 8/1991 | Ambrose | 439/77 |
| 5,045,921 | 9/1991 | Lin et al. | 357/74 |
| 5,087,877 | 2/1992 | Frentz et al. | 324/158 P |
| 5,170,328 | 12/1992 | Kruppa | 361/398 |
| 5,198,965 | 3/1993 | Curtis et al. | 361/717 |
| 5,205,741 | 4/1993 | Steen et al. | 439/70 |
| 5,224,023 | 6/1993 | Smith et al. | 361/412 |
| 5,265,322 | 11/1993 | Fisher et al. | 29/848 |
| 5,430,614 | 7/1995 | Difrancesco | 361/785 |
| 5,438,749 | 8/1995 | Runyon | 29/825 |
| 5,548,223 | 8/1996 | Cole et al. | 324/754 |

*Primary Examiner*—Josie Ballato
*Assistant Examiner*—Russell M. Kobert
*Attorney, Agent, or Firm*—Skjerven, Morrill, MacPherson, Franklin & Friel LLP; Brian D. Ogonowsky

[57] ABSTRACT

An electrical test fixture used to connect the probes of an electronic test instrument to the pins of any integrated circuit. Made from flexible material, the fixture folds above the integrated circuit under test bringing test point pins to useable position. The integrated circuit ususally is soldered to the test fixture and the test fixture soldered into the target circuit. Provides for noninvasive pickoff of integrated circuit signals. Allows production versions of a design to be identical to the prototype version.

37 Claims, 6 Drawing Sheets

Exploded View - SMD/PCB Mountable, Unfolded

Figure 1
Exploded View - Surface Mount, Unfolded

Figure 2

Figure 3
Exploded View - Multiple Layers, Unfolded

Figure 4
Exploded View - Dual-In Line Mount, Unfolded

Figure 5
Exploded View - SMD/PCB Mountable, Unfolded

Figure 6

Figure 7
Exploded View - Stiffener

FLEXIBLE ELECTRICAL TEST FIXTURE FOR INTEGRATED CIRCUITS ON PROTOTYPE AND PRODUCTION PRINTED CIRCUIT BOARDS

This is a continuation of application Ser. No. 08/622,814 filed Mar. 27, 1996 now U.S. Pat. No. 5,692,911.

FIELD OF INVENTION

This invention relates to the field of test fixtures which provide for the connection of the probes of electronic test equipment to integrated circuits on prototype and production printed circuit boards.

The invention is particularly useful, though not exclusively applicable, to the reliable connection of logic analyzer and oscilloscope probes to high density, multi-pin integrated circuits.

BACKGROUND OF THE INVENTION

Recent advances in the state-of-the-art in microcircuits involve two interrelated parameters germane to the Flexible Electrical Test Fixture (FETF) for integrated circuits on prototype and production printed circuit boards. These advances consist of increases in microcircuit density, and increases in microcircuit switching speed.

Increasing the microcircuit density in the mechanical implementation of a design involves the placement of more functionality into a single integrated circuit, and bringing the integrated circuit packages on-board closer together. The Surface Mount Device (SMD), allowing high pin counts with close proximity mounting, was created for this purpose. Increased switching speed increases transmission line effects in the circuit. Switching speed increases are gained by reducing inductance and capacitance in the transmission lines which is primarily accomplished through the use of the higher density packaging described above.

The process of developing an electronic design from concept through finished product usually requires a prototyping stage. This prototyping stage can involve a physical implementation of all or part of the electronic design on a printed circuit board. This stage of development is used to demonstrate the validity of the design and also exposes design flaws (bugs) that need to be addressed prior to the manufacture of production quantities of the printed circuit board.

Ideally, the prototype printed circuit board is made as similar as possible to the anticipated production version in an attempt to preclude new "bugs" from appearing in the production board which were not present in the prototype printed circuit board. However, because of the testability requirements of these boards, the prototype printed circuit board requires allowances for the circuit designer to gain access to pins on the integrated circuits used in the design. Usually, the designer will connect either logic analyzer or oscilloscope probes to the pins of his circuit during the testing process. This connection between integrated circuit pins and logic analyzer or oscilloscope probes can be accomplished in a number of ways currently existing in the art:

1) test points associated with each integrated circuit pin to be monitored are designed onto the printed circuit board,
2) connection is made via a single tip probe adapter,
3) connection is made via a clip-on probe adapter,
4) connection is made via a socketable probe adapter.

The first method can provide access to as many or all of the pins of the integrated circuits of a design at the discretion of the designer. Any integrated circuit pin which is not included as a test point may be difficult to test during the prototyping phase. Further, the inclusion of test points, especially a large number of test points, creates an assembly which is usually different from the production version in that the number of test points required for the prototype is much larger than the limited requirement on a production board. Further, inclusion of these test points can add substantial capacitance and inductance to the transmission structure between integrated circuits, and can cause an otherwise competent design to malfunction. Assemblies with a large number of test points are physically larger than a counterpart with no or a limited number of test points.

The second method requires a fine tip or small clip-on adapter suitable for individual pins. The method is restrictive and cumbersome in that it allows test of only a limited number of pins at the same time. Some integrated circuits are not testable in this way due to the pitch of the pins, or the placement of pins under the body of the integrated circuit.

The third method clips an adapter onto the pins of the integrated circuit. As in method two, some integrated circuits are not testable in this way due to the pitch of the pins or the placement of pins under the body of the integrated circuit. For high pitch pins, this method is characteristically susceptible to shorting pins together, and is therefore unreliable. Further, substantial side clearance is required in the board layout.

In the fourth method, one or more of the printed circuit board's integrated circuits are plugged into a socket for normal operation. For test, the integrated circuit is removed from its socket and plugged into a socketable probe adapter. The socketable probe adapter is then plugged into the original integrated circuit's socket. Sockets are classically unreliable in the long term, and add extra lead length, capacitance and inductance to the circuit. Some integrated circuits cannot be socketted. The sockets also require substantial side clearance in the board layout. When under test, the integrated circuit is socketted into the adapter which is in turn socketted into the board's socket. Two sockets are involved in connecting the integrated circuit to the printed circuit board. Inductance and capacitance are further increased. Some high speed designs which would otherwise be competent will fail to perform or show bugs which would not exist in a layout without sockets.

The third and fourth method are currently widely used for testing integrated circuits. Because there are many integrated circuit foot-prints, many different adapters are needed for test. They are individually expensive, but are reusable from design to design. However, because of repetitive mechanical insertion and extraction, these "reusable" adapters become unreliable with age.

OBJECTS

The current state-of-the-art in integrated circuit testing has no method for connecting an oscilloscope of logic analyzer to a circuit under test in an unintrusive way. The currently existent methods cannot be universally employed and either effect the operation of the circuit, the physical layout of the design, or are unreliable.

Accordingly, it is a first object of the present invention to provide an electrically unintrusive method to connect a logic analyzer or oscilloscope to any pin of any integrated circuit, such that there is negligible difference between the operation of the integrated circuit under test (prototype) conditions and under normal operation (production) conditions due to this connection.

It is a second object of the present invention to allow the connection of all of the pins of any integrated circuit to a logic analyzer or oscilloscope.

It is a third object of the present invention to allow the physical construction of a prototype printed circuit board to be identical to the production version of the printed circuit board.

It is a fourth object of the present invention to allow the process of prototype printed circuit board development to be identical to that of the production version, less the FETF, of the same printed circuit board in the placement of integrated circuits and the fabrication of the printed circuit board itself.

It is a fifth object of the present invention to provide a reliable electrical test fixture for integrated circuits which, by its nature and cost, is disposable after its term of use on a single printed circuit board.

A completely new and innovative method for the attachment of a logic analyzer or oscilloscope probes to integrated circuits under test is defined.

ADVANTAGES

The present invention provides a generic method for the attachment of logic analyzer or oscilloscope probes to any integrated circuit. In this attachment, the FETF does not insert any meaningful circuitry between the integrated circuit and the printed circuit board. Therefore, the FETF does not add significant capacitance, inductance or lead length between in-circuit devices or to the process of in-circuit integrated circuit testing. High speed circuits are not made inoperative through the addition of the FETF. Because of its flexible construction, the FETF does not substantially increase the side clearance requirements in the board layout and thereby allows higher packaging densities in both prototype and production versions of a design. Because of the unintrusive nature of the FETF, prototype board layouts can be identical to that defined for the production version. Because the prototype and production versions of a printed circuit board are identical, manufacturing processes can be the same for the two assemblies, with the FETF removed for the production version. Further, the FETF can be made very inexpensively relative to adapter technology, and because it is soldered in place, the FETF provides a reliable connection for the life of its use on prototype and production printed circuit boards. Because it is inexpensive and that it is soldered in place, the FETF can be included as an integral part of the production printed circuit board.

NOVEL DIFFERENCE BETWEEN THE PRESENT INVENTION AND THE ART

The present invention provides for the mechanical and electrical insertion of a flexible printed circuit board between the pins of an integrated circuit and the rigid printed circuit board to which it would otherwise be mounted. Test points are attached to the flexible printed circuit board in areas adjoining the integrated circuit's attachment points, and are electrically connected to these attachment points. The areas which contain test points are folded above the integrated circuit making the test points accessible to the probes of an electronic test instrument.

No other existing method (i.e. test points, single tip probe adapter, clip-on probe adapter, or socketable probe adapter) provides for signal access and pick-off from between the integrated circuit and its external printed circuit board. Neither do any of the existing methods use the flexible printed circuit board to bring the signals of the integrated circuit to a position above the body of the integrated circuit where they are easily accessible to the probes of an electronic test instrument and decrease the side clearance required to use a test fixture.

Further, as all of the attachment points can be of a solderable type, the electrical connection between the integrated circuit and the external printed circuit board is substantially lower in resistance, inductance and capacitance and more reliable than the clip-on and socketable alternatives. When used with solderable attachment points, the invention is essentially a single use, disposable test fixture while the clip-on and socketable alternatives are reusable and become unreliable with age.

SUMMARY OF THE INVENTION

The basic invention consists of:

1) a flexible printed circuit board,
2) a first attachment mechanism having attachment points, generally, but not necessarily having the same number of attachment points arranged in the same pin pattern of the integrated circuit, for attaching the pins of an integrated to the flexible printed circuit board, and
3) one or more test point mechanisms mounted on the flexible printed circuit board in one or more areas adjoining the first attachment mechanism, each test point mechanism having a number of test points. The total number of test points is, generally, but not necessarily, equal to the number of pins of the integrated circuit. Each test point is electrically connected to one or more of the attachment points.

An integrated circuit to be tested is mounted at the first attachment mechanism's attachment points, and the areas of the flexible printed circuit board containing test points are folded above the integrated circuit making the test points accessible to the probes of an electronic test instrument, such as an oscilloscope or logic analyzer. This form of the invention allows for the test of an integrated circuit in a stand-alone mode without reference to external circuitry.

In one variation to the basic the invention, the flexible printed circuit board has a second attachment mechanism having attachment points by which the flexible printed circuit board can be attached to the attachment points of an external printed circuit board for in-circuit testing.

All attachment points may be of a solderable surface mount, solderable through-hole, or pressure-insertion contact type.

Several other variations to the basic invention are presented.

GENERAL DEFINITIONS integrated circuit—a means containing a functional circuit and having a package having a number of pins for electrically connecting the I/O structure of the functional circuit to an external circuit.

pin pattern—the physical pattern formed by the pins of an integrated circuit.

DESCRIPTION OF THE INVENTION

Applicability

The present invention provides for the electrical connection of an oscilloscope probe, a logic analyzer probe, or other test apparatus to the pins of all types of integrated circuits.

Embodiments of the Invention

The embodiments of the present invention combine a flexible printed circuit board, a method for mounting an integrated circuit, and test points to create a family of new electrical test fixtures. Each embodiment provides for the electrical connection of the probes of an electrical testing instrument, such as an oscilloscope, a logic analyzer, or other test apparatus to the pins of the integrated circuit.

In the following constructions, a simple 14 pin integrated circuit foot print pattern is used to demonstrate the invention, and avoid the proliferation of drawing and text associated with including a construction for every foot print pattern currently available. There are over 100 integrated circuit foot print patterns in use. We teach that this invention is applicable and extensible to any integrated circuit foot print pattern. Each possible foot print pattern can create a new and different member of the family of new electrical test fixtures.

Construction of the First Embodiment

This embodiment is applicable for integrated circuits with Surface Mount or Ball Grid Array mounting pins.

Figure 1:
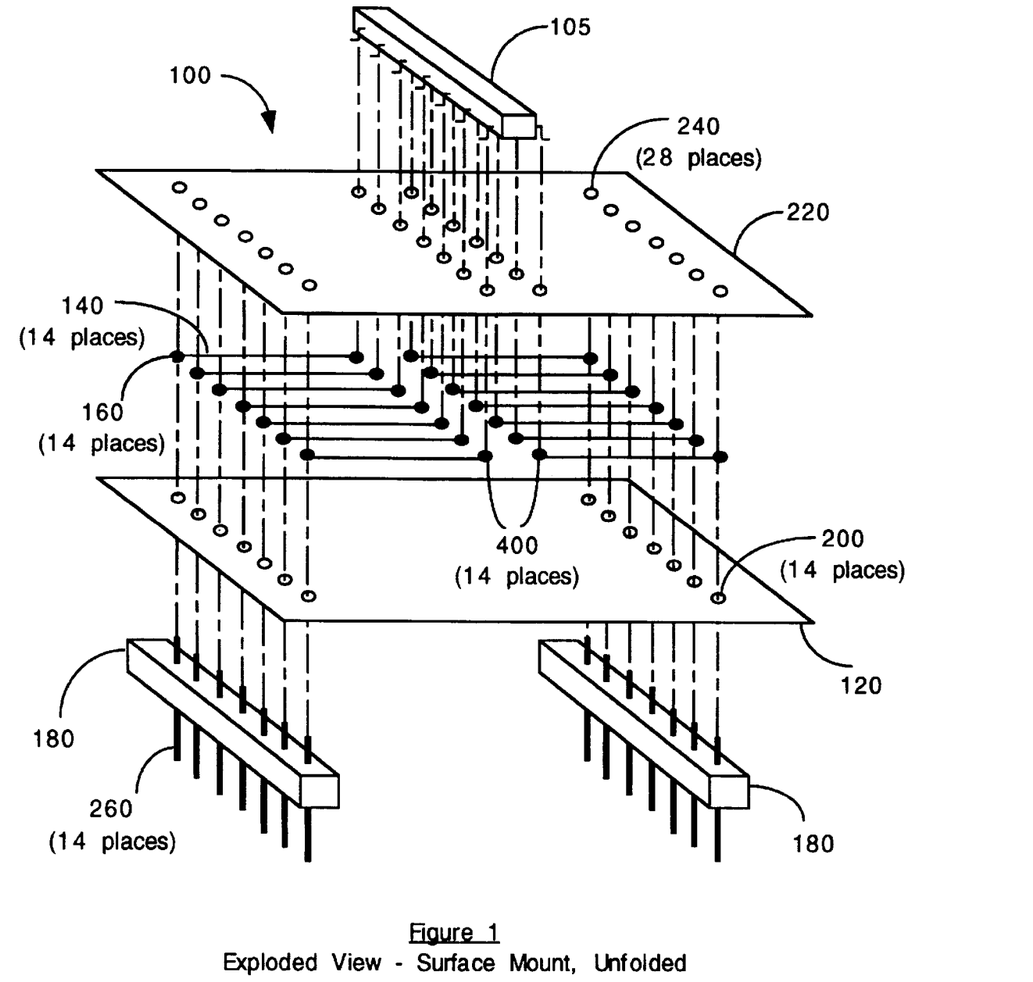
FIG. 1 shows an exploded view of the first embodiment of the invention in its unfolded form constructed as to mate with a 14 pin surface mount integrated circuit.

This embodiment provides for the electrical connection of the pins of a surface mounted integrated circuit 105 to the probes of an electrical test instrument (not shown) via the Flexible Electrical Test Fixture 100. The attachment mechanism of a ball grid array integrated circuit is constructed identically to this construction using a different pin pattern. Note that this invention does not preclude the replacement of the integrated circuit with an equivalent integrated circuit socket. Note also that this invention is extensible to surface mountable or ball grid array integrated circuits of any pin count, pin pattern, or pitch. For integrated circuits with pins on all four sides or pins under chip, the flexible printed circuit board 300 may assume the shape of an "X" or "T" with extremities of the flexible printed circuit board 300 extending away from all four sides of the integrated circuit.

The Flexible Electrical Test Fixture 100, as constructed to mate with a 14 pin surface mount integrated circuit 105, is shown in its flat form prior to folding in FIG. 1. The Flexible Electrical Test Fixture 100 is composed of:

1) a flexible printed circuit board assembly 300 (see FIG. 2) which is constructed as follows: In the preferred method, the flexible printed circuit board assembly 300 is fabricated from a thin base layer 120 made from a flexible material such as Kapton. To achieve flexibility, the thickness of this Kapton base layer 120 will generally be in the range of 1 to 5 milli-inch in the region of the fold. Holes 200 are provided in the base layer 120 to allow the passage of the test point assembly 180 mounting pins.

Electrical circuits 140 are constructed on top of the base layer 120 using a flexible, conductive material such as annealed copper. The conductive material is first glued to the base 120 and then photo-chemically etched to form the electrical circuits 140 between mounting pin solder pads 160 and the integrated circuit mounting pads 400 according to a user specified schematic. FIG. 1 shows an electrical circuit which connects a single test point assembly 180 mounting pin to each integrated circuit 105 mounting pin.

The conductive material provides solderable areas on the mounting pin solder pads 160 for attachment of the test point assembly 180 mounting pins. The conductive material also provides solderable areas on the integrated circuit mounting pads 400 for attachment of the integrated circuit 105 mounting pins. These solderable areas are, generally, arranged to fit the mounting pin pattern of the test point assembly 180 and the integrated circuit 105, respectively.

A top layer 220 of Kapton is then glued over the annealed copper electrical circuits 140 and onto the exposed area of the Kapton base 120. Holes 240 are provided in the top layer 220 which expose the mounting pin solder pads 160 and integrated circuit mounting pads 400 to allow for the soldering of the test point assembly 180 mounting pins and the integrated circuit 105 pins. Through-holes which accommodate the pins of the test point assembly 180 are drilled through associated solder pads 160.

2) a test point assembly 180. The mounting pins of the test point assembly 180 are passed through the holes 200 in the base layer 120, the holes in the mounting pin solder pads 160, and the holes 240 in top layer 220, and soldered to the mounting pin solder pads 160. The test point assembly is mounted on the bottom of the base layer 120 so that the test point pins 260 attain an upright position upon folding of the flexible printed circuit board assembly 300.

Figure 2:
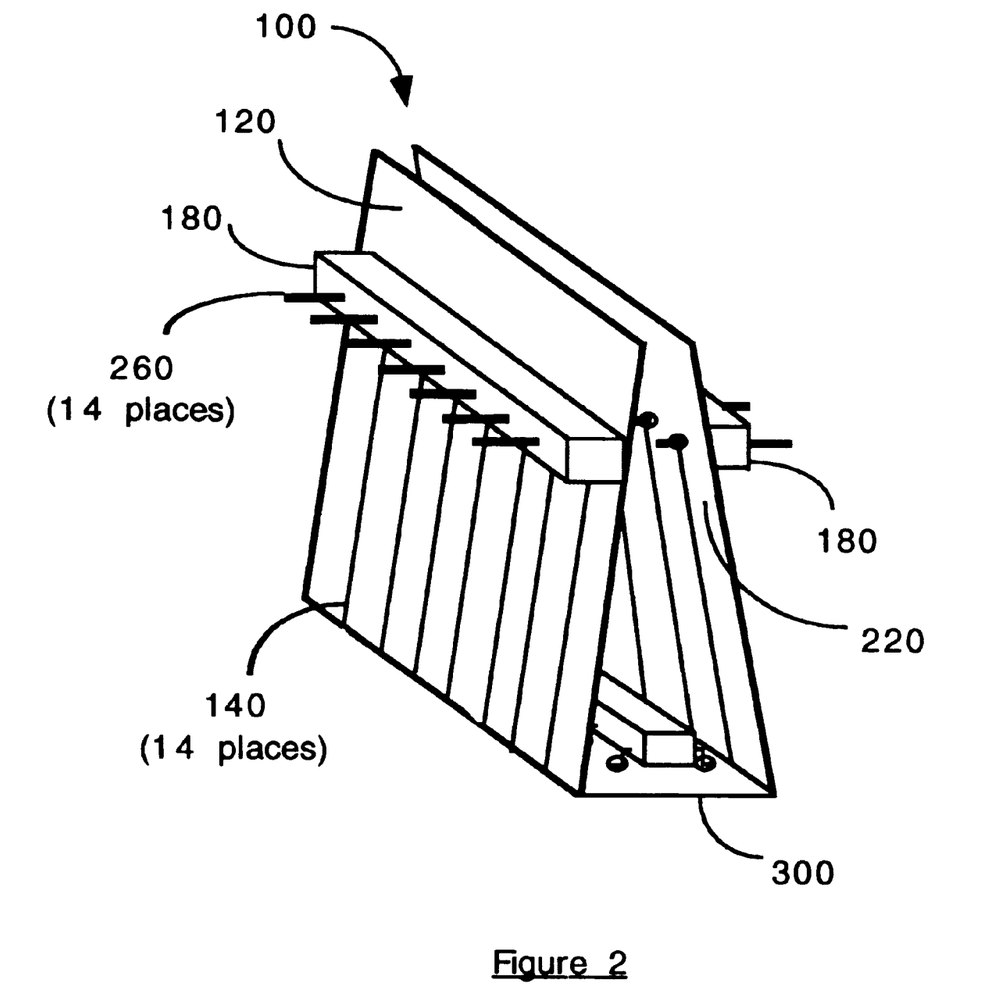
FIG. 2 shows the first embodiment of the invention in its folded form.

After the Flexible Electrical Test Fixture 100 is assembled flat, it is folded, as shown in FIG. 2, with the extremities of base layer 120 forming an acute angle to residual flat portion of the base layer 120 under integrated circuit 105, the folds being in proximity to the outside margins of the integrated circuit 105 mounting pins, until the test point assembly 180 test point pins 260 are folded above the position of the integrated circuit such that the test points are accessible to the probes of the electronic testing instrument.

Operation of the First Embodiment

In this embodiment, the integrated circuit 105 is operated in a stand-alone mode. Power and other supporting signals are brought into the integrated circuit 105 by attaching the appropriate power supply and signal connections at the test point pins 260. Test probes are also attached at the test point pins 260. Power and signals are passed to the integrated circuit along the test point pins 260, through the electrical circuits 140, and into the integrated circuit 105. Signals from the integrated circuit 105 are passed along the electrical circuits 140 and onto the test point pins 260 to the test probes.

Construction of the Second Embodiment

Figure 3:
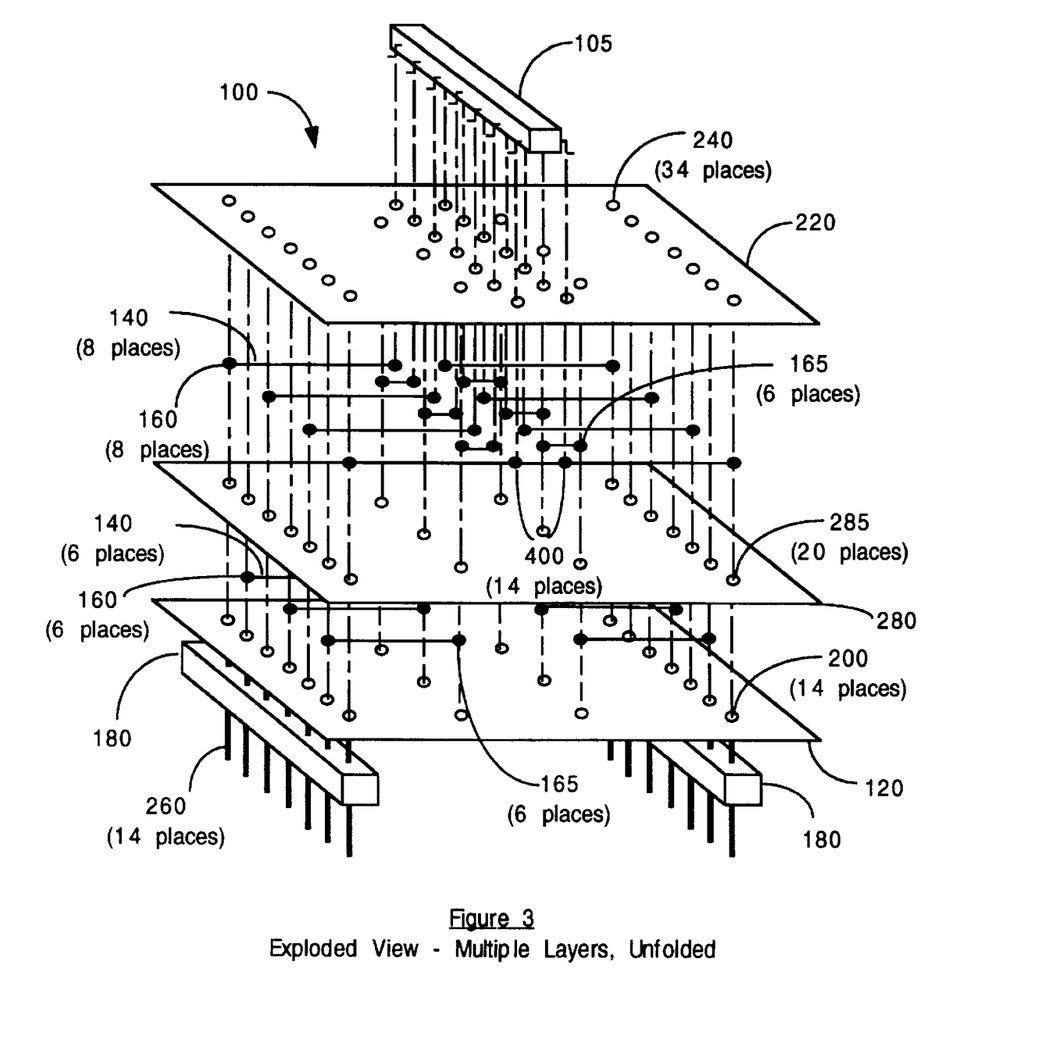
FIG. 3 shows an exploded view of the second embodiment of the invention in its unfolded form showing multiple layers in the flexibile printed circuit board.

This embodiment allows for more complex electrical circuits by adding additional conductive and nonconductive layers to the flexible printed circuit board assembly 300.

FIG. 3 shows how an additional layer of electrical circuits 140 is added by gluing an additional layer 280 of Kapton between the base layer 120 and the top layer 220. Electrical circuits 140 are constructed as in the First Embodiment and inserted between the top layer 220 and the additional layer 280, and between the additional layer 280 and the base layer 120. Holes 285 are provided in the additional layer 280 to allow passage of the test point assembly 180 mounting pins, and plating of vias 165. Additional holes 200 are included in base layer 120 to allow access to the vias 165. Additional holes 240 are included in top layer 220 to allow access to the vias 165.

Further additional layers can be created by adding alternating layers of Kapton and electrical circuitry, constructing and mounting them in the method taught in the Construction of the First Embodiment.

This embodiment is folded as in the First Embodiment and has the appearance shown in FIG. 2.

Operation of the Second Embodiment

Operation of the Second Embodiment is identical to the operation of the First Embodiment.

Construction of the Third Embodiment

Figure 4:
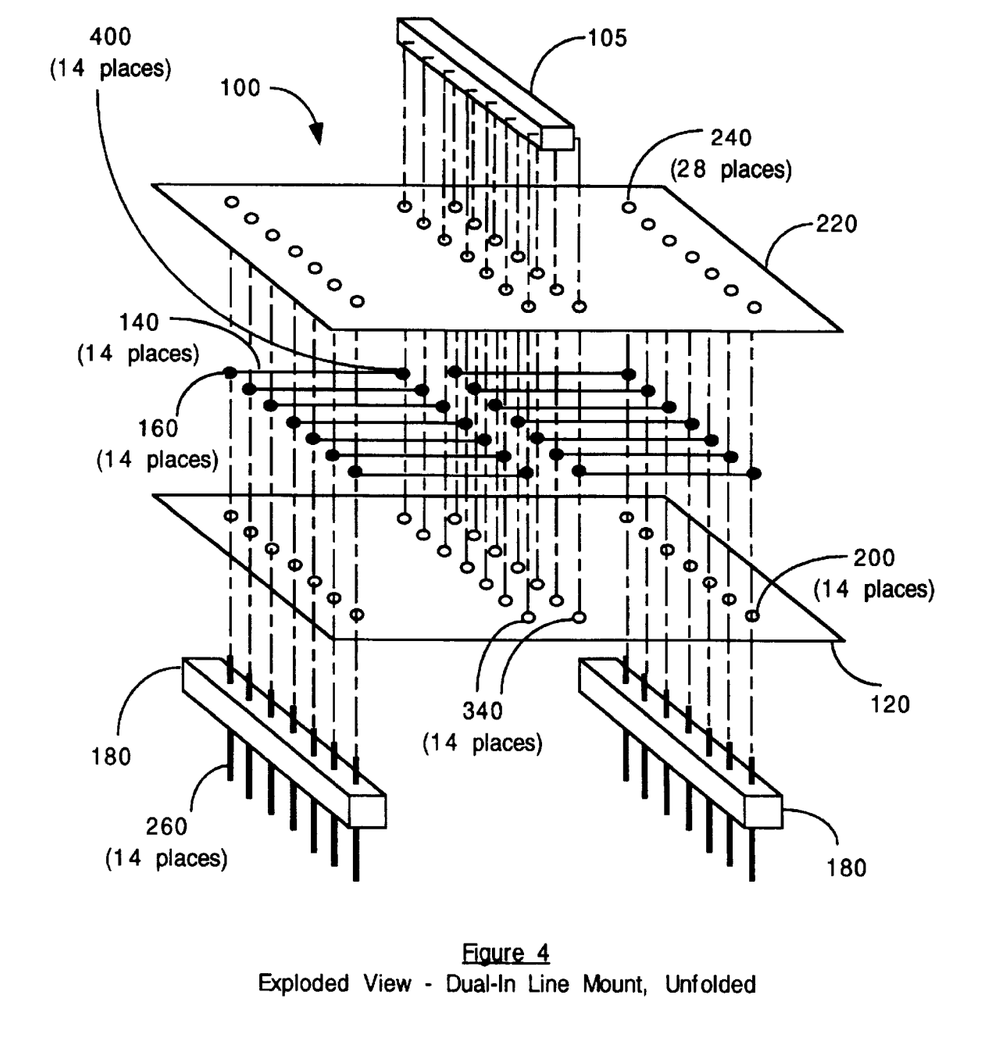
FIG. 4 shows an exploded view of the third embodiment of the invention in its unfolded form constructed as to mate with a 14 pin dual-in-line integrated circuit.

This embodiment, shown in FIG. 4, is applicable for integrated circuits with Dual In-Line mounting pins. These mounting pins are of the through-hole type.

The construction of this embodiment is identical to the construction of the First Embodiment except as it relates to the accommodation of dual-in-line integrated circuits. Dual-in-line integrated circuits have pins which are intended to be through-hole mounted. Additional holes 340 are included in the base layer 120 and the integrated circuit mounting pads 400 are drilled through. When mounted, the integrated circuit 105 mounting pins project below the Flexible Electrical Test Fixture 100 and can be further soldered to an external assembly such as an external printed circuit board containing electrical circuits associated with the integrated circuit 105.

Operation of the Third Embodiment

The Third Embodiment can be operated as the First Embodiment.

Additionally, this embodiment, when connected to an external electrical circuit via the pins of the dual-in-line integrated circuit 105 as they project out of the bottom of base layer 120, does not need the power and signal support provided through the Flexible Electrical Test Fixture 100 as in the Operation of the First Embodiment. These are provided by the external electrical circuit.

Construction of the Fourth Embodiment

Figure 5:
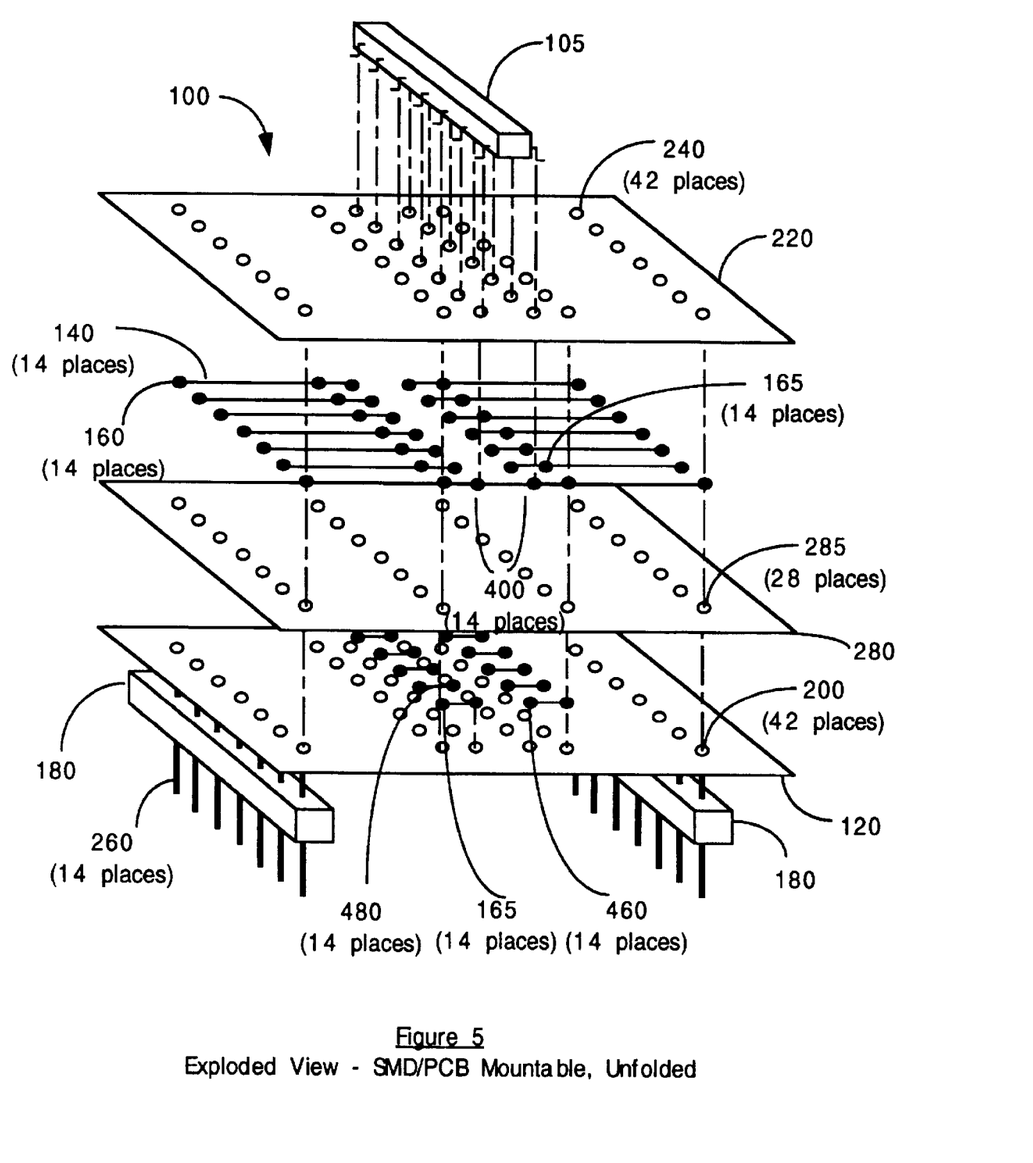
FIG. 5 shows an exploded view of the fourth embodiment of the invention in its unfolded form constructed as to mate with a 14 pin surface mount integrated circuit and an external printed circuit board.

This embodiment is applicable for integrated circuits with Surface Mount or Ball Grid Array mounting pins and is shown in FIG. 5. This embodiment is identical to the first embodiment except that it contains a provision for the Flexible Electrical Test Fixture to be electrically and mechanically connected to an external circuit through its mounting on an external printed circuit board. An additional layer 280 and additional electrical circuits 480 are inserted as in the second embodiment.

In this embodiment, the electrical circuits 140 have vias 165 added to them. Vias 165 connect to additional electrical circuits 480 and to solderable pads 460 positioned between the base layer 120 and the additional layer 280. Additional holes 200 are made in base layer 120 to provide access to the vias 165 and the solderable pads 460. In the preferred form of this embodiment, the solder pads 460 are suitable for flow soldering and are arranged in the same pin pattern as the integrated circuit 105. This will allow the direct replacement of the Flexible Electrical Test Fixture as mounted on a target printed circuit board with the integrated circuit 105.

Operation of the Fourth Embodiment

The Fourth Embodiment can be operated as the First Embodiment.

Additionally, this embodiment, when connected to an external electrical circuit via the solderable pads 460, does not need the power and signal support provided through the Flexible Electrical Test Fixture 100 as in the Operation of the First Embodiment. These are provided by the external electrical circuit.

Locking Variation to the Embodiments

Figure 6:
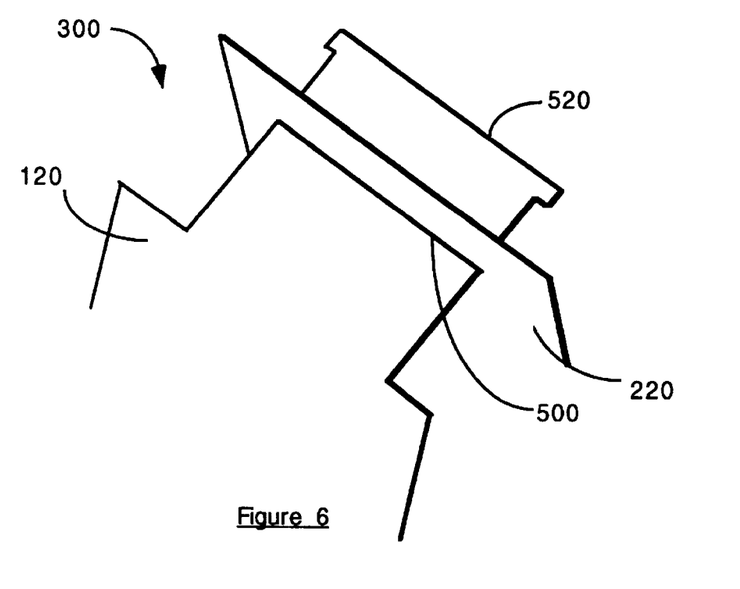
FIG. 6 shows one locking mechanism for holding the folds together.

FIG. 6 shows a construction of the folded flexible printed circuit board 300 with the folded tips locked into place using a locking mechanism. There are many ways to lock the tips together. FIG. 6 shows only one of these possibilities. This locking variation may be employed on any of the various embodiments of the invention.

One of the folded sides of flexible printed circuit board 300 is constructed with slot 500. The other folded side of flexible printed circuit board 300 is constructed with tab 520. When the flexible printed circuit board 300 is folded, tab 520 is pressed through slot 500, thereby locking the folded sides in place.

Operation of the Locking Variation

When the Flexible Electrical Test Fixture is in use with probes attached, the locking mechanism resists pressure on the flexible printed circuit board to unfold. The locking mechanism remains locked and the folds stay folded.

Stiffening Variation to the Embodiments

Figure 7:
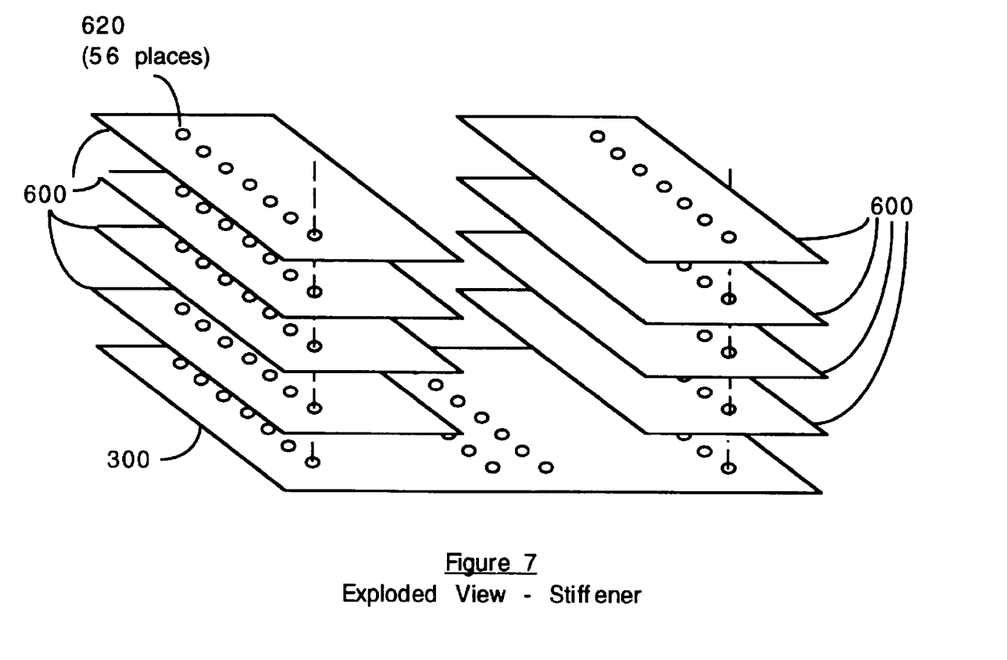
FIG. 7 shows one method of stiffening the folded area of the flexible printed circuit board.

FIG. 7 shows a method for stiffening the flexible printed circuit board 300 in the area from the fold outward to the end of the extremities. The stiffening agent is formed from stiffening layers 600 of Kapton glued to the flexible printed circuit board 300. Holes 620 are included in each stiffening layer 600 to pass the mounting pins of the test point assembly. FIG. 7 shows the addition of four stiffening layers 600.

The stiffening agent can be added to any of the embodiments of the invention.

Operation of the Stiffening Variation

When the Flexible Electrical Test Fixture is in use with probes attached, the stiffening agent resists pressure on the flexible printed circuit board to bend in the area of the test points.

Pin Cutout Variation

This variation is applicable to any of the embodiments of the invention. The folds are made in proximity to the outside of the pin pattern of the integrated circuit. For folds made outside the pin pattern, the fold can be made continuous. Side clearance for the invention can be reduced if the fold is made inside the pin pattern of the integrated circuit. To place the fold inside the pin pattern, a cutout is made around the integrated circuit pins of the pin pattern, and the fold in the flexible printed circuit board produced by bending Kapton through the opening between the pins.

Component Variation

This variation is applicable to any of the embodiments of the invention. The electrical circuits connecting the test point pins 260 to the integrated circuit mounting pads 400 are augmented with resistors, capacitors, or other active or passive components according to a user specified schematic.

Concluding Remarks

It should now be apparent to those skilled in the art that a completely new and innovative method for the attachment of a logic analyzer or oscilloscope probes to integrated circuits under test is defined. The Flexible Electrical Test Fixture provides an electrically unintrusive method to connect a logic analyzer or oscilloscope to any pin of any integrated circuit, such that there is negligible difference between the operation of the integrated circuit under test (prototype) conditions and under normal operation (production) conditions due to this connection.

It should also be apparent that the present invention allows the connection of all of the pins of any integrated circuit to a logic analyzer or oscilloscope.

It should be further apparent that the present invention allows the physical construction of a prototype printed circuit board to be identical to the production version of the printed circuit board.

It should be further apparent that the present invention allows the process of prototype printed circuit board development to be identical to that of the production version, less the FETF, of the same printed circuit board in the placement of integrated circuits and the fabrication of the printed circuit board itself. Also, it should be apparent that the present invention provides a reliable electrical test fixture for integrated circuits which, by its nature and cost, is disposable after its term of use on a single printed circuit board.

It should be further apparent to those skilled in the art that various changes in the form and the details of the invention as shown and described may be made. It is intended that such changes be included within the spirit and scope of the claims appended hereto.

We claim:

1. An electrical device comprising:
   a flexible circuit having a top side and a bottom side, said flexible circuit containing conductors;
   a plurality of first conductive terminal points on said top side of said flexible circuit in electrical contact with said conductors, said plurality of first conductive terminal points being arranged in a first pattern matching at least a portion of a pattern of terminals of an integrated circuit package for being soldered to at least some of said terminals of said package when said package is mounted over said top side of said flexible circuit and said package is mounted over terminals on a substrate;
   a plurality of second conductive terminal points on said bottom side of said flexible circuit, said second conductive terminal points being in electrical contact with said conductors and with said first conductive terminal points, said second conductive terminal points being arranged in a second pattern matching said first pattern for being soldered to said terminals on said substrate when said substrate is located under said bottom side of said flexible circuit; and
   a plurality of access terminals in electrical contact with said conductors, said plurality of access terminals being accessible for electrical connection to an external electrical circuit when said integrated circuit package terminals are soldered to said plurality of first conductive terminal points on said top side of said flexible circuit and said second conductive terminal points are soldered to said terminals on said substrate.

2. The device of claim 1 wherein said first pattern of first conductive terminal points on said top side of said flexible circuit are configured to match at least a portion of a pattern of terminals on a ball grid array package.

3. The device of claim 1 wherein said substrate comprises a printed circuit board.

4. The device of claim 3 wherein said printed circuit board is rigid.

5. The device of claim 1 wherein said first conductive terminal points comprise contact pads formed on said top surface of said flexible circuit.

6. The device of claim 1 wherein said first conductive terminal points comprise planted holes formed through said flexible circuit.

7. The device of claim 1 wherein said second conductive terminal points comprise solder balls arranged in said second pattern.

8. The device of claim 1 wherein said first conductive terminal points on said top side of said flexible circuit are electrically connected to said second conductive terminal points on said bottom side of said flexible circuit by conductive vias formed through said flexible circuit.

9. The device of claim 1 wherein said first conductive terminal points on said top side of said flexible circuit are electrically connected to said second conductive terminal points on said bottom side of said flexible circuit by plated holes formed through said flexible circuit.

10. The device of claim 1 wherein first pattern matches at least a portion of a pattern of terminals of a surface mounted package.

11. The device of claim 1 wherein said first pattern matches at least a portion of a pattern of terminals of a dual in-line package.

12. The device of claim 1 further comprising terminals of a ball grid array package soldered to said first conductive terminal points.

13. The device of claim 1 further comprising said second conductive terminal points being soldered to terminals on said substrate.

14. The device of claim 13 wherein in said substrate is a printed circuit board.

15. The device of claim 1 wherein said first conductive terminal points are soldered to terminals of a ball grid array package, and said second conductive terminal points are soldered to terminals on a printed circuit board.

16. The device of claim 1 wherein said first conductive terminal points are soldered to terminals of a surface mounted package.

17. The device of claim 1 wherein said flexible circuit has extended portions which extend beyond said integrated circuit package when said terminals of said integrated circuit package are physically connected to said first conductive terminal points, said extended portions containing said plurality of access terminals, said extended portions being bent in a direction away from said substrate.

18. The device of claim 17 wherein said extended portions are bent so that said plurality of access terminals are located substantially above said plurality of first conductive terminal points.

19. The device of claim 1 wherein said access terminals are connected to a testing device for monitoring signals at said terminals of said integrated circuit package.

20. The device of claim 1 wherein said terminals of said integrated circuit package are physically connected to said plurality of first conductive terminal points.

21. The device of claim 20 wherein said terminals on said substrate are physically connected to said plurality of second conductive terminal points.

22. The device of claim 1 wherein said terminals on said substrate are physically connected to said plurality of second conductive terminal points.

23. The device of claim 1 wherein said terminals of said integrated circuit package are electrically connected to said plurality of first conductive terminal points.

24. The device of claim 23 wherein said terminals on said substrate are electrically connected to said plurality of second conductive terminal points.

25. The device of claim 1 wherein said terminals on said substrate are electrically connected to said plurality of second conductive terminal points.

26. An electrical device comprising:
   a passive circuit having a top side and a bottom side, said passive circuit being a dielectric material containing conductors;
   a plurality of first conductive terminal points on said top side of said passive circuit in electrical contact with said conductors, said plurality of first conductive terminal points being arranged in a first pattern matching at least a portion of a pattern of terminals of an integrated circuit package for being soldered to at least some of said terminals of said package when said package is mounted over said top side of said passive circuit and said package is mounted over terminals on a substrate;

a plurality of second conductive terminal points on said bottom side of said passive circuit, said second conductive terminal points being in electrical contact with said conductors and with said first conductive terminal points, said second conductive terminal points being arranged in a second pattern matching said first pattern for being soldered to said terminals on said substrate when said substrate is located under said bottom side of said passive circuit; and a plurality of access terminals supported by said passive circuit in electrical contact with said conductors, said plurality of access terminals being accessible for electrical connection to an external electrical circuit when said integrated circuit package terminals are soldered to said plurality of first conductive terminal points on said top side of said passive circuit and said second conductive terminal points are soldered to said terminals on said substrate.

27. The device of claim 26 wherein said first pattern of first conductive terminal points on said top side of said passive circuit are configured to match at least a portion of a pattern of terminals on a ball grid array package.

28. The device of claim 26 wherein said substrate comprises a printed circuit board.

29. The device of claim 26 wherein said first conductive terminal points comprise contact pads formed on said top surface of said passive circuit.

30. The device of claim 26 wherein said first conductive terminal points comprise plated holes formed through said passive circuit.

31. The device of claim 26 wherein said second conductive terminal points comprise solder balls arranged in said second pattern.

32. The device of claim 26 wherein said first conductive terminal points on said top side of said passive circuit are electrically connected to said second conductive terminal points on said bottom side of said passive circuit by conductive vias formed through said flexible circuit.

33. The device of claim 26 wherein said first conductive terminal points on said top side of said passive circuit are electrically connected to said second conductive terminal points on said bottom side of said flexible circuit by plated holes formed through said flexible circuit.

34. The device of claim 26 wherein said first pattern matches at least a portion of a pattern of terminals of a surface mounted package.

35. The device of claim 26 wherein said terminals of said integrated circuit package are physically connected to said plurality of first conductive terminal points.

36. The device of claim 26 wherein said terminals on said substrate are physically connected to said plurality of second conductive terminal points.

37. The device of claim 26 wherein said passive circuit is flexible.

* * * * *